(12) United States Patent
Ohmi et al.

(10) Patent No.: US 8,399,862 B2
(45) Date of Patent: Mar. 19, 2013

(54) ION IMPLANTING APPARATUS AND ION IMPLANTING METHOD

(75) Inventors: Tadahiro Ohmi, Sendai (JP); Tetsuya Goto, Sendai (JP); Akinobu Teramoto, Sendai (JP); Takaaki Matsuoka, Sendai (JP)

(73) Assignees: National University Corporation Tohoku University, Miyagi (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/521,019

(22) PCT Filed: Dec. 20, 2007

(86) PCT No.: PCT/JP2007/074480
§ 371 (c)(1),
(2), (4) Date: Jun. 24, 2009

(87) PCT Pub. No.: WO2008/078636
PCT Pub. Date: Jul. 3, 2008

(65) Prior Publication Data
US 2010/0025821 A1 Feb. 4, 2010

(30) Foreign Application Priority Data
Dec. 25, 2006 (JP) ................. 2006-348315

(51) Int. Cl.
*G21K 5/10* (2006.01)
*H01S 3/00* (2006.01)
*H05H 3/02* (2006.01)
*A61N 5/00* (2006.01)
*G21G 5/00* (2006.01)
*G21G 4/00* (2006.01)

(52) U.S. Cl. ................. 250/492.21; 250/492.3; 438/516
(58) Field of Classification Search ................. 438/514, 438/513, 516; 257/607, E29.106; 427/523; 118/723 I, 723 IR; 250/492.21, 492.3
See application file for complete search history.

(56) References Cited

U.S. PATENT DOCUMENTS

| 5,525,159 | A | * | 6/1996 | Hama et al. | |
| 7,767,055 | B2 | * | 8/2010 | Himori et al. | 156/345.47 |
| 2005/0260354 | A1 | * | 11/2005 | Singh et al. | 427/523 |

(Continued)

FOREIGN PATENT DOCUMENTS

| JP | 2001-271168 A | 10/2001 |
| JP | 2005-196994 A | 7/2005 |

(Continued)

OTHER PUBLICATIONS

International Search Report for PCT/JP2007/074480 dated Mar. 18, 2008.

(Continued)

*Primary Examiner* — Olik Chaudhuri
*Assistant Examiner* — Wilner Jean Baptiste
(74) *Attorney, Agent, or Firm* — Pearne & Gordon LLP

(57) ABSTRACT

When positively charged ions are implanted into a target substrate, charge-up damage may occur on the target substrate. In order to suppress charge-up caused by secondary electrons emitted from the target substrate when positively charged ions are implanted, a conductive member is installed at a position facing the target substrate and electrically grounded with respect to a high frequency. Further, a field intensity generated in the target substrate may be reduced by controlling an RF power applied to the target substrate in pulse mode.

19 Claims, 11 Drawing Sheets

U.S. PATENT DOCUMENTS

| | | | |
|---|---|---|---|
| 2009/0169768 A1* | 7/2009 | Ueda et al. | 427/569 |
| 2009/0205782 A1* | 8/2009 | Ohmi et al. | 156/345.34 |
| 2010/0170440 A9* | 7/2010 | Mizukami et al. | 118/723 E |

FOREIGN PATENT DOCUMENTS

| | | |
|---|---|---|
| JP | 2006-196752 A | 7/2006 |
| JP | 2006-324404 A | 11/2006 |

OTHER PUBLICATIONS

Korean Office action for 10-2009-7014713 dated Feb. 10, 2011.

Taiwanese Office action for 096150043 dated Jan. 19, 2012.

* cited by examiner

FIG. 2
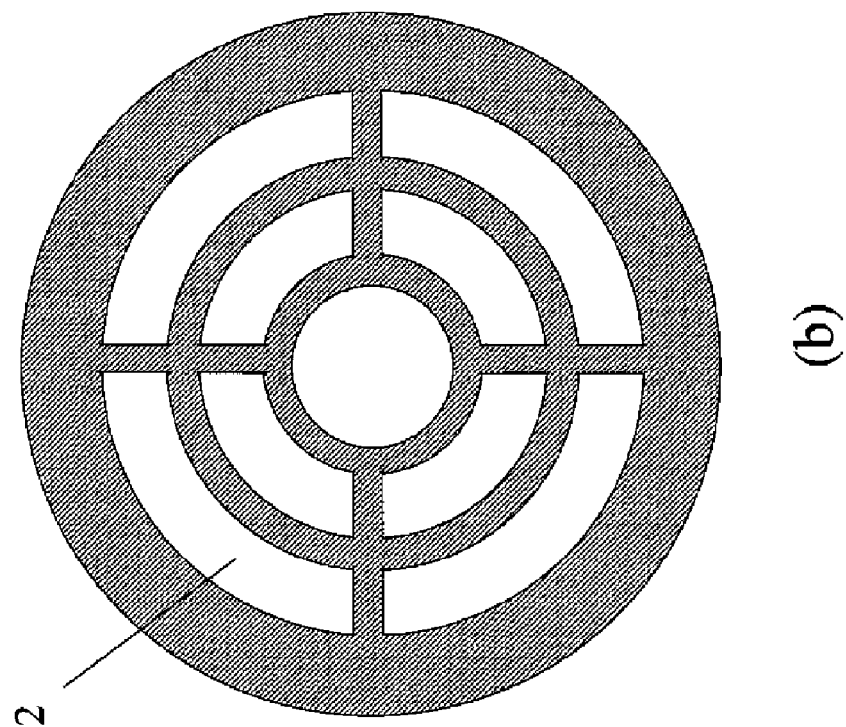
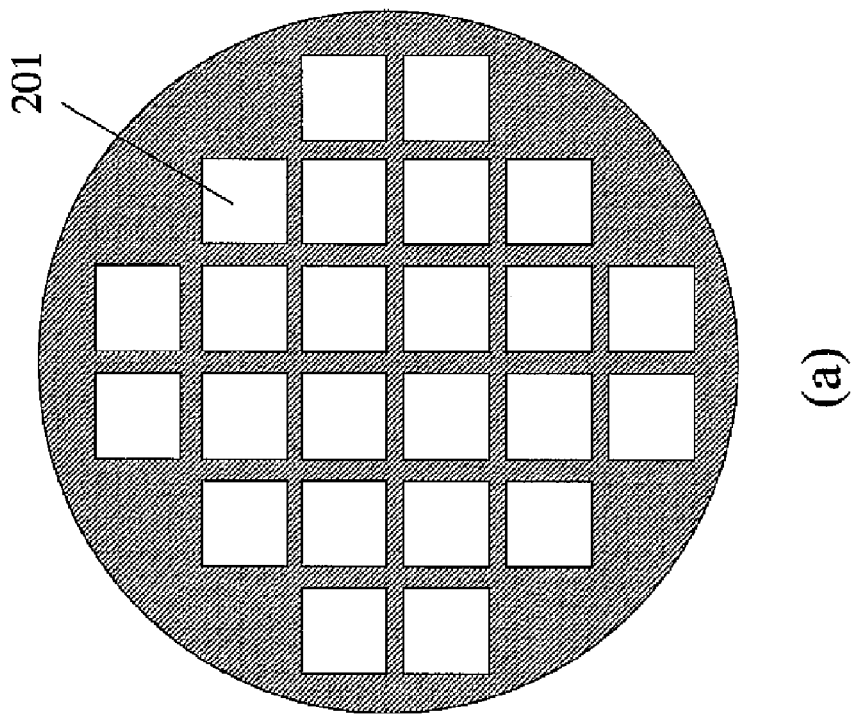

| PLASMA DENSITY (cm$^{-3}$) | DEBYE LENGTH (mm) | SHEATH THICKNESS (mm) |
|---|---|---|
| $10^{13}$ | 0.003 | 0.01 |
| $10^{12}$ | 0.011 | 0.04 |
| $10^{11}$ | 0.033 | 0.13 |
| $10^{10}$ | 0.105 | 0.41 |

8,399,862 B2

ION IMPLANTING APPARATUS AND ION IMPLANTING METHOD

TECHNICAL FIELD

The present invention relates to an ion implanting apparatus and an ion implanting method.

BACKGROUND ART

Conventionally, when manufacturing a semiconductor device or the like, there has been widely used an ion implanting technique as a method for introducing impurities into a semiconductor substrate, a semiconductor layer, or the like. In a conventional ion implanting technique, in order to implant desired atoms/molecules with a predetermined concentration into a target object such as a semiconductor substrate or a semiconductor layer, a positively charged ion beam is irradiated onto a desired spot of the target object. Accordingly, positively charged ions are irradiated onto the target object and secondary electrons are emitted from the target object, so that the target object is largely charged up and thus charge-up damage may occur thereon. For example, if ions are irradiated onto a polysilicon gate electrode layer on a gate insulating film in order to dope impurities into the polysilicon gate electrode layer, a large quantity of secondary electrons are emitted from the polysilicon layer and positive charges are accumulated on a surface of the polysilicon layer, and positive charges of the implanted ions are added thereon, whereby a large quantity of negative charges are accumulated on the gate insulating film. Meanwhile, if ions are implanted into a n-well in order to form a p-type source/drain region, a large quantity of positive charges are accumulated on a surface of the n-well for the same reason, thereby causing a breakdown of the gate insulating film. Therefore, product failure has often occurred in a p-channel MOS transistor.

Meanwhile, disclosed in Patent Document 1 is an ion implanting apparatus including a processing chamber having a plurality of exhaust ports; a holding table installed within the processing chamber, for holding a target object; a shower plate disposed to face the target object and having a plurality of gas discharge holes; and a microwave antenna.

Patent Document 1: Japanese Patent Laid-open Publication No. 2005-196994

DISCLOSURE OF THE INVENTION

Problems to Be Solved by the Invention

Patent Document 1 does not disclose a charge-up damage occurring in a target object, particularly product failure occurring in a p-channel MOS transistor.

Accordingly, a technical object of the present invention is to provide an atom/molecule implanting technique capable of preventing charge-up damage, and an object of the present invention is to provide an ion implanting apparatus and an ion implanting method capable of suppressing charge-up damage.

Means for Solving the Problems

In accordance with a first aspect of the present invention, there is provided an ion implanting apparatus including: a depressurizable processing chamber; a plasma excitation unit for exciting plasma within the processing chamber; a holding table installed in the processing chamber, for holding a target substrate; a conductive member disposed so as to face the holding table in the processing chamber, having a portion through which the plasma is transmitted toward the holding table; and an RF power application unit for applying RF power for substrate bias onto the target substrate held by the holding table, and the conductive member is electrically grounded with respect to a frequency of the RF power.

In accordance with a second aspect of the present invention, in the first aspect, the plasma excitation unit may include a unit for supplying plasma excitation power to an inside of the processing chamber and a unit for supplying a plasma excitation gas to the inside of the processing chamber.

In accordance with a third aspect of the present invention, in the second aspect, the plasma excitation gas may include a source gas for ions to be implanted into the target substrate.

In accordance with a fourth aspect of the present invention, in the second or the third aspect, a frequency of the plasma excitation power may be in a range of a frequency of a microwave.

In accordance with a fifth aspect of the present invention, in any one of the second to the fourth aspects, the unit for supplying the plasma excitation power to the inside of the processing chamber may includes a microwave source; a flat plate antenna; and a unit for transmitting a microwave from the microwave source to the antenna, and the antenna may be disposed to face the holding table with a dielectric plate therebetween, and the microwave radiated from the antenna may propagate through the dielectric plate and irradiate the plasma excitation gas in the processing chamber so as to generate plasma.

In accordance with a sixth aspect of the present invention, in any one of the second to the fifth aspects, the unit for supplying the plasma excitation gas may include a plurality of gas paths for discharging the plasma excitation gas into the processing chamber via a gas supply port and an inside of the dielectric plate, and the plasma may be generated in a space where the plasma excitation gas is discharged into the processing chamber from the dielectric plate or in its vicinity.

In accordance with a seventh aspect of the present invention, in any one of the second to the fifth aspects, in the processing chamber, an electron density of the plasma in a space opposite to the holding table with respect to the conductive member may be higher than a cut-off density determined by $\omega^2 m \epsilon_0 / e^2$ where an angular frequency of the plasma excitation power is $\omega$, a permittivity in vacuum is $\epsilon_0$, mass of an electron is m, and an elementary electric charge is e.

In accordance with an eighth aspect of the present invention, in the fourth or the sixth aspect, the plasma excitation gas may include a fluoride gas, and a pressure within the processing chamber may be set such that an electron density of the plasma in a space opposite to the holding table with respect to the conductive member is maintained higher than a cut-off density determined by $\omega^2 m \epsilon_0 / e^2$ where an angular frequency of the microwave is $\omega$, a permittivity in vacuum is $\epsilon_0$, mass of an electron is m, and an elementary electric charge is e.

In accordance with a ninth aspect of the present invention, in the sixth aspect, within the processing chamber, an electron density of the plasma in a space opposite to the holding table with respect to the conductive member and at a position where the plasma is in contact with the dielectric plate at a side of the conductive member with a plasma sheath therebetween may be higher than a cut-off density determined by $\omega^2 m \epsilon_0 / e^2$ where an angular frequency of the microwave supplied to the antenna is $\omega$, a permittivity in vacuum is $\epsilon_0$, mass of an electron is m, and an elementary electric charge is e.

In accordance with a tenth aspect of the present invention, in the sixth or the ninth aspect, the formula 1 may be expressed as follow:

$$\sqrt{ne^2/(m\epsilon_0)} \qquad \text{[Formula 1]}$$

When a plasma angular frequency determined by the formula 1 (where, n is an electron density of plasma at a position where the plasma is in contact with the dielectric plate at a side of the conductive member with a plasma sheath therebetween, $\epsilon_0$ is a permittivity in vacuum, m is mass of an electron, and e is an elementary electric charge) is $\omega_{pe}$ and an angular frequency of the microwave supplied to the antenna is $\omega$, a distance between the dielectric plate, the formula 2 may be expressed as follow:

$$c/\sqrt{\omega_{pe}^2-\omega^2} \qquad \text{[Formula 2]}$$

A distance between the dielectric plate and the conductive member may be longer than a microwave penetration depth determined by the formula 2 (here, c is speed of light in vacuum).

In accordance with an eleventh aspect of the present invention, in the sixth, the ninth or the tenth aspect, the formula 3 may be expressed as follow:

$$\sqrt{ne^2/(m\epsilon_0)} \qquad \text{[Formula 3]}$$

When a plasma angular frequency determined by the formula 3 (where n is an electron density of plasma at a position where the plasma is in contact with the dielectric plate at a side of the conductive member with a plasma sheath therebetween, $\epsilon_0$ is a permittivity in vacuum, m is mass of an electron, and e is an elementary electric charge) is $\omega_{pe}$ and an angular frequency of the microwave supplied to the antenna is $\omega$, the formula 2 may be expressed as follow:

$$c/\sqrt{\omega_{pe}^2-\omega^2} \qquad \text{[Formula 4]}$$

A distance between the dielectric plate and the conductive member may be three or more times longer than a microwave penetration depth determined by the formula 4 (here, c is speed of light in vacuum).

In accordance with a twelfth aspect of the present invention, in any one of the fifth to the eleventh aspects, the antenna may be a radial line slot antenna.

In accordance with a thirteenth aspect of the present invention, in any one of the first to the twelfth aspects, the conductive member may be electrically grounded with respect to a direct current.

In accordance with a fourteenth aspect of the present invention, in any one of the first to the thirteenth aspects, at least a portion of inner walls of the processing chamber in contact with the plasma and a surface of the conductive member may be coated with at least one of metal oxide and metal nitride.

In accordance with a fifteenth aspect of the present invention, in any one of the first to the fourteenth aspects, the conductive member may include therein a unit through which a temperature control medium flows.

In accordance with a sixteenth aspect of the present invention, in any one of the first to the fifteenth aspects, a period of the frequency of the RF power may be longer than a time during which implantation atom ions or implantation molecule ions released from the plasma toward a plasma sheath formed on a surface of the target substrate reaches the target substrate.

In accordance with a seventeenth aspect of the present invention, in the sixth aspect and any one of the ninth to the sixteenth aspects, a porous ceramic member may be installed at each gas discharge position of the plurality of gas paths, and the plasma excitation gas may be introduced into the processing chamber from the porous ceramic member.

In accordance with an eighteenth aspect of the present invention, in the sixth aspect and any one of the ninth to the seventeenth aspects, each gas discharge hole of the plurality of gas paths may have a diameter two or less times larger than a thickness of a sheath formed between the dielectric plate and the plasma, and the plasma excitation gas may be introduced into the processing chamber from the gas discharge hole.

In accordance with a nineteenth aspect of the present invention, in any one of the first to the eighteenth aspects, the ion implanting apparatus may further include a unit for cooling the holding table.

In accordance with a twentieth aspect of the present invention, in any one of the first to the nineteenth aspects, the holding table may include therein a unit through which cooling medium flows.

In accordance with a twenty-first aspect of the present invention, in any one of the first to the twentieth aspects, there is provided an ion implanting method for performing an ion implantation by using the ion implanting apparatus.

In accordance with a twenty-second aspect of the present invention, in the twenty-first aspect, the ion implantation may be performed plural times by applying the RF power in the form of pulses.

In accordance with a twenty-third aspect of the present invention, in the twenty-second aspect, the pulse may have a predetermined width and interval and the interval of the pulse may be longer than the product of a reciprocal of a ratio of the number of electrons to the total number of ion electric charges in the plasma for a unit volume, a coefficient of secondary electrons emitted from the target substrate and the width of the pulse.

In accordance with a twenty-fourth aspect of the present invention, in any one of the twenty-first to the twenty-third aspects, a plasma excitation gas may be a fluoride gas of atom ions to be implanted or a mixed gas made by diluting the fluoride gas of the atom ions to be implanted with a rare gas.

In accordance with a twenty-fifth aspect of the present invention, in any one of the twenty-first to the twenty-fourth aspects, a plasma excitation gas may be a gas selected from $BF_3$, $PF_3$ and $AsF_3$ or a mixed gas made by diluting a gas selected from $BF_3$, $PF_3$ and $AsF_3$ with at least one kind of rare gas selected from Ar, Kr and Xe.

In accordance with a twenty-sixth aspect of the present invention, in the twenty-fourth or the twenty-fifth aspect, the target substrate may include silicon and the target substrate may be cooled to a temperature lower than a volatilization temperature of a silicon fluoride under a pressure of the processing chamber.

In accordance with a twenty-seventh aspect of the present invention, there is provided a semiconductor device manufactured by using the ion implanting apparatus as described in any one of the first to the twentieth aspects.

In accordance with a twenty-eighth aspect of the present invention, there is provided a semiconductor device manufactured by using the ion implanting method as described in any one of the twenty-first to the twenty-sixth aspects.

In accordance with a twenty-ninth aspect of the present invention, there is provided a semiconductor device manufacturing method including a process for performing ion implantation according to the ion implanting method as described in any one of the twenty-first to the twenty-sixth aspects.

Effect of the Invention

In accordance with the present invention, an ion implanting apparatus and an ion implanting method capable of suppressing charge-up damage can be obtained. In particular, in accordance with the present invention, product failure which may occur in manufacturing a p-channel MOS transistor may be greatly reduced and thus production yield can be improved.

BRIEF DESCRIPTION OF THE DRAWINGS

FIGS. 2(a) and 2(b) are plane views illustrating major components of the ion implanting apparatus in accordance with the embodiment of the present invention;

FIG. 3 illustrates a table showing a relationship between a plasma density, a Debye length and a sheath thickness;

EXPLANATION OF CODES

Figure 1:
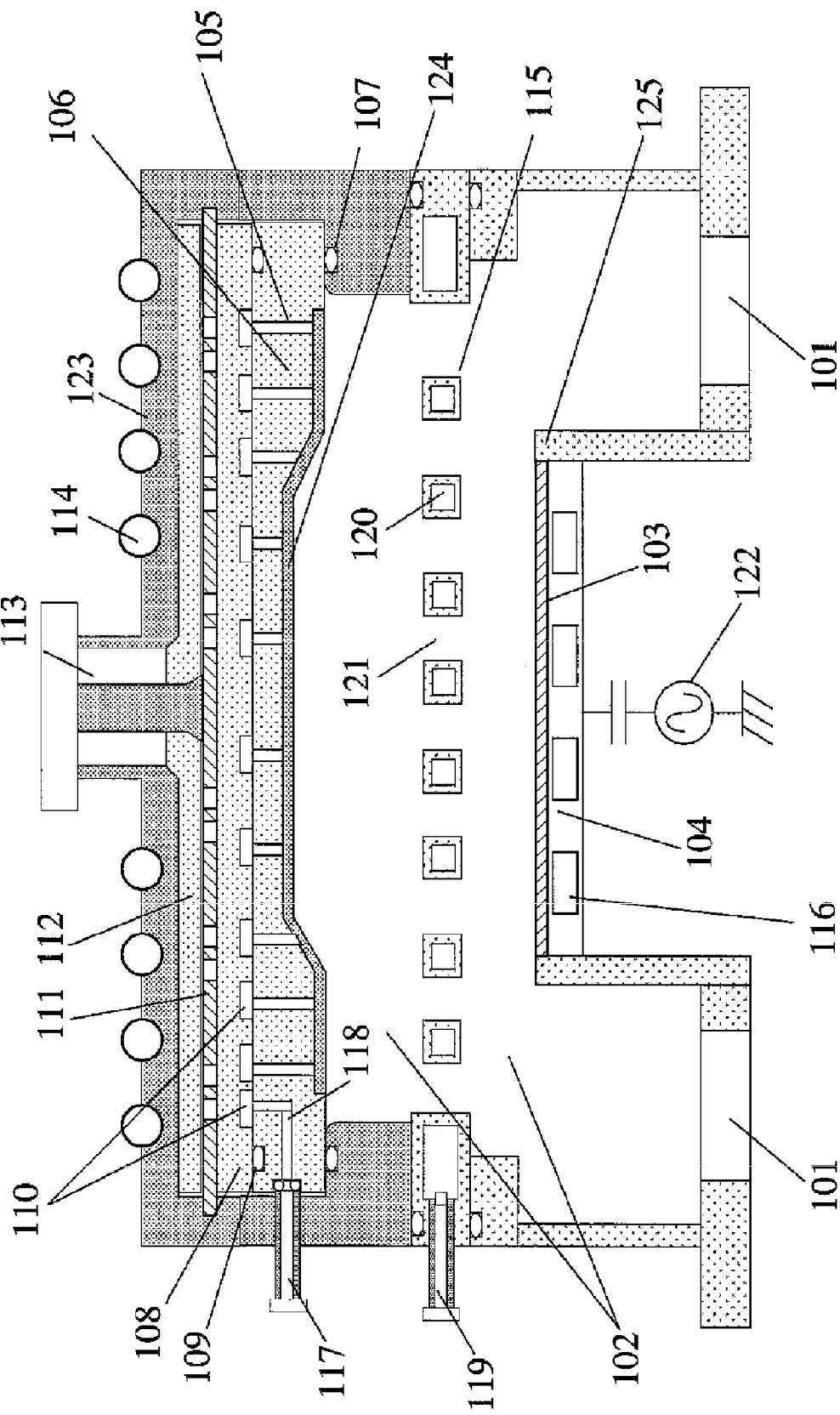
FIG. 1 is a schematic cross-sectional view illustrating an ion implanting apparatus in accordance with an embodiment of the present invention.

101: Exhaust port
102: Processing chamber
103: Target substrate
104: Holding table
105: Gas discharge hole
106: Shower plate
107: Seal ring
108: Cover plate
109: Seal ring
117: Plasma excitation gas supply port
118: Supply hole
110: Space
111: Slot plate
112: Wavelength shortening plate
113: Coaxial waveguide
123: Metal plate
114: Cooling path
115: Ground plate
120: Medium path
121: Transmission window
122: RF power supply
124: Porous ceramic layer
125: Ring-shaped insulating member

BEST MODE FOR CARRYING OUT THE INVENTION

Hereinafter, embodiments of the present invention will be described in detail with reference to the accompanying drawings.

First Embodiment

FIG. 1 shows a microwave plasma ion implanting apparatus in accordance with a first embodiment of the present invention. The illustrated microwave plasma ion implanting apparatus includes a processing chamber 102 for exhausting gases via a plurality of exhaust ports 101 and a holding table 104 for holding a target substrate 103 in the processing chamber 102. The processing chamber 102 is manufactured by using wall members made of an Al alloy (Al containing Zr and Mg). It is desirable to form a firm protective film on inner surfaces of the wall, particularly on a portion exposed to plasma since the portion can be damaged by a large quantity of ions irradiated thereto from the plasma. In the present embodiment, the wall surfaces are coated with a dense non-porous $Al_2O_3$ protective film having a thickness of 0.5 μm formed by anodic oxidation using a non-aqueous solution. The protective film is not limited thereto, so it may be, e.g., a thermally sprayed film of $Y_2O_3$, a film formed by a sol-gel method, or an $Al_2O_3$ protective film on which an $Y_2O_3$ film is additionally formed.

In order to exhaust the processing chamber 102 uniformly, the processing chamber 102 includes a ring-shaped space around the holding table 104 and the plurality of exhaust ports 101 are axial-symmetrically arranged at an equal distance with respect to the target substrate so as to communicate with the ring-shaped space. With the arrangement of the exhaust ports 101, it is possible to exhaust a gas of the processing chamber 102 via the exhaust ports 101 uniformly.

Installed at an opening in the top part of the processing chamber 102 is a plate-shaped shower plate 106 made of a dielectric alumina having a dielectric constant of about 9.8 and a low microwave dielectric loss (a dielectric loss of about $1 \times 10^{-4}$ or less) and provided with a number of openings (e.g., about 230 openings), i.e., gas discharge holes 105 via a seal ring 107 so as to face the target substrate 103 on the holding table 104. Further, on an outer side of the shower plate 106, i.e., on the opposite side of the holding table 104 with respect to the shower plate 106, there is disposed a cover plate 108 made of alumina via another seal ring 109. These shower plate 106 and cover plate 108 constitute a part of an outer wall of the processing chamber 102.

Formed between the top surface of the shower plate 106 and the cover plate 108 are spaces 110 which are charged up with a plasma excitation gas supplied through a supply hole 118 opened in the shower plate 106 from a plasma excitation gas supply port 117 and communicating with the spaces 110. In other words, there are formed grooves at positions in the cover plate 108 each corresponding and connected to the gas discharge holes 105 of the shower plate 106, and the spaces 110 are formed between the shower plate 106 and the cover plate 108. The gas discharge holes 105 are disposed to be connected with the spaces 110. Provided on outlets of the gas discharge holes 105 at the side of the processing chamber 102 is a porous ceramic layer 124. When the plasma excitation gas is introduced into the processing chamber 102, since the gas is discharged from a large area, the porous ceramic layer 124 functions to reduce a gas flow rate and enable a gas to uniformly flow without disturbing a flow of the gas. Furthermore, in the present embodiment, though the porous ceramic layer 124 is installed on the entire surface, except an outer peripheral portion, of the shower plate 106 facing the target substrate 103, it is possible to reduce the gas flow rate by installing the porous ceramic layer 124 only locally on the outlets of the gas discharge holes 105.

On the top surface of the cover plate 108, a slot plate 111 of a radial line slot antenna having a plurality of open slots for radiating a microwave, a wavelength shortening plate 112 for propagating the microwave in a diametric direction, and a coaxial waveguide 113 for introducing the microwave to the antenna are installed. Moreover, the wavelength shortening plate 112 is interposed between the slot plate 111 and a metal plate 123. Provided in the metal plate 123 are cooling paths 114. The microwave radiated from the slot plate 111 is transmitted to the cover plate 108 and the shower plate 106; is introduced into a upper space of the processing chamber 102; and ionizes the plasma excitation gas discharged from the porous ceramic layer 124 in the upper space, whereby high density plasma is generated at a region of several mm directly under the porous ceramic layer 124. The generated plasma reaches the target substrate 103 by diffusion.

The illustrated shower plate 106 has a diameter of about 400 mm and its outer peripheral portion has a thickness of about 35 mm. In a diameter range of from about 155 mm to about 165 mm, a taper portion is formed, and the shower plate in a range having a diameter less than about 155 mm has a thickness of about 25 mm. In this example, the angle of the taper portion is about 45°, but not limited thereto. Further, it is desirable to round off corners of the taper portion so as to suppress electric field concentration. In addition, a heat flux introduced by exposing the shower plate 106 to the high density plasma is discharged out by a coolant such as water flowing through the cooling path 114 via the slot plate 111, the wavelength shortening plate 112 and the metal plate 113.

In the plasma ion implanting apparatus illustrated in FIG. 1, a ground plate 115 is installed within the processing chamber 102. The ground plate 115 is disposed between the shower plate 106 and the holding table 104 for mounting the target substrate 103 thereon; made of semiconductor such as an aluminum alloy; provided with a transmission window 121 through which the plasma generated right under the shower plate 106 can propagate by diffusion; and electrically grounded.

Illustrated in FIG. 2 is a plane view of the ground plate 115, in particular, a shape of the transmission window. The transmission window 121 may be divided by grid pattern members to form a matrix shape as indicated by a reference numeral 201 in FIG. 2(a) or may be formed in a ring shape as indicated by a reference numeral 202 in FIG. 2(b). By varying a ratio of an opening area in the transmission window 121, plasma transmittance can be controlled. The ground plate 115 functions to provide a fixed potential to the inside of the processing chamber 102, in addition to this, it may have a temperature control function, particularly, a cooling function.

When implanting the ions, it is necessary to provide energy to the ions reaching the target substrate 103. In order to do so, an electrode installed within the holding table 104 is connected with an RF power supply 122 via a condenser and an RF power is applied thereto, so that a self-bias voltage is generated on the target substrate 103. In this case, since the ground plate 115 becomes a ground surface when the RF power is applied to the electrode for the target substrate 103, a negative self-bias voltage can be generated on the surface of the target substrate 103 while hardly increasing a time-averaged plasma potential.

If the plasma potential is increased, the energy of the ions irradiated onto the inner wall of the processing chamber 102 increases, thereby causing contamination.

As long as the ground plate 115 is grounded at a high frequency with respect to an RF frequency, an increase in the plasma potential can be prevented, so that the ground plate 115 is not necessarily grounded with respect to a direct current. Therefore, for example, by applying a negative DC potential to the ground plate 115, it may be possible to use the ground plate 115 as a means for supplying electrons to the plasma by using secondary electrons emitted by ions.

If a radio frequency is low, sheath impedance increases and thus a high self-bias voltage is generated. Therefore, it is desirable to set a frequency to be as relatively low as, e.g., about 1 MHz or less.

In the present embodiment, an RF power having a frequency of 400 kHz is applied from the RF power supply 122 to the target substrate 103. Further, in order to perform a temperature control (in particular, cooling) of the target substrate 103, a path 16 through which a temperature control medium flows is provided in the holding table 104. Furthermore, in order to hold and fix the target substrate 103, a non-illustrated electrostatic chuck electrode is provided in the holding table 104.

In the example of FIG. 1, the holding table 104 is made of a conductor to serve as an electrode for the target substrate 103 as well, and in order to surround its periphery (in this example, to surround the periphery of the target substrate 103), a ring-shaped insulating member 125 is installed as a part of the wall member of the processing chamber 102. Though the ring-shaped insulating member 125 can be made of a conductor, it may be eroded by high energy ions irradiated thereon, which may cause contamination of the target substrate 103 or deterioration of reproducibility. Accordingly, it is desirable to make the insulating member 125 by using ceramic such as $Al_2O_3$ or $Y_2O_3$ having excellent plasma resistance or an insulating member or a conductive member of which a surface is coated with a film made of ceramic. Otherwise, it is also desirable to use the same material as that of the target substrate 103, e.g., silicon or the like, as a constituent material or a coating material.

Figure 9:
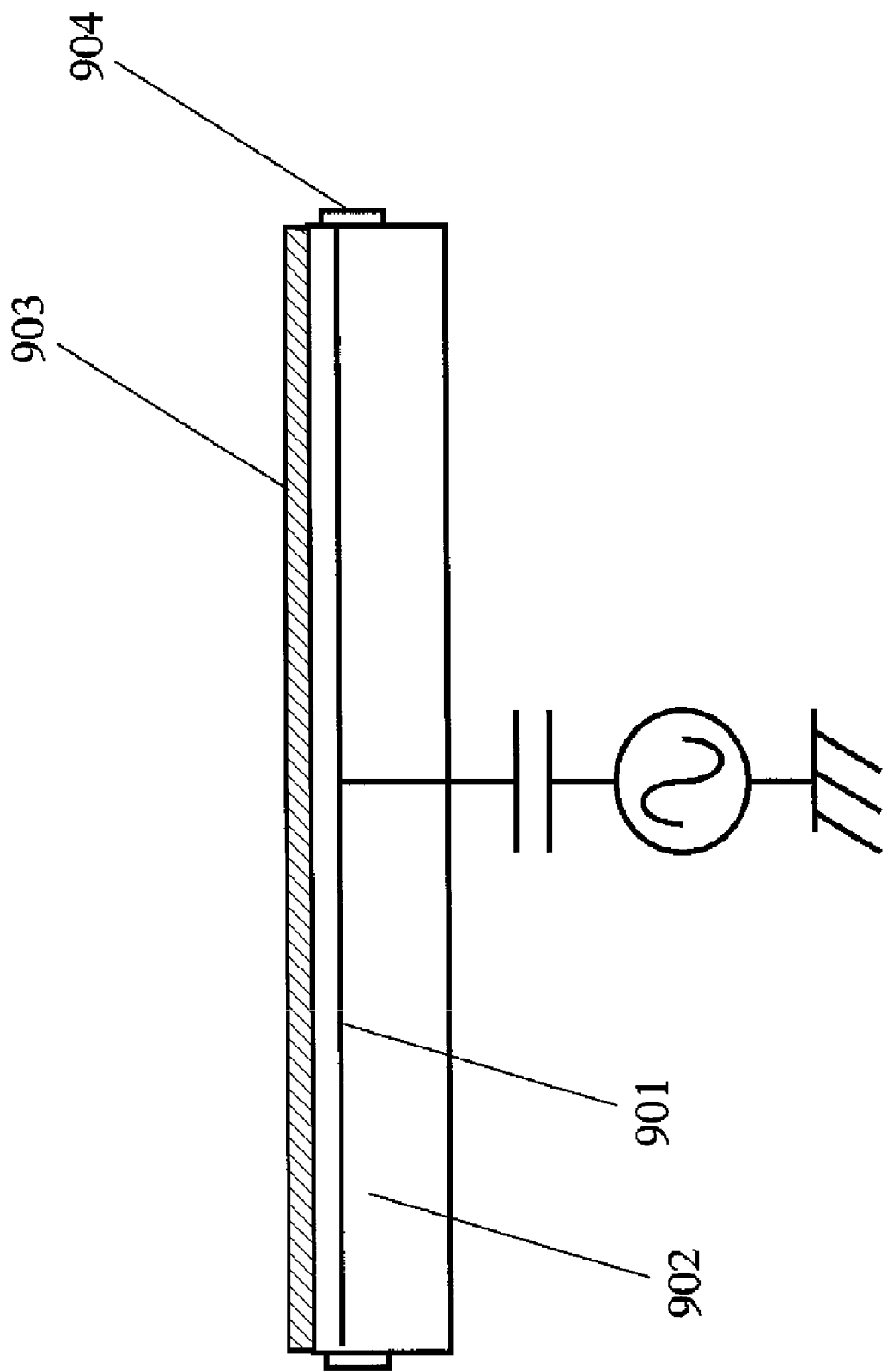
FIG. 9 is a schematic cross-sectional view to illustrate other major components of the ion implanting apparatus in accordance with the embodiment of the present invention.

Further, instead of installing the ring-shaped insulating member 125 illustrated in FIG. 1, it may be possible, as illustrated in FIG. 9, to fasten a supporting table 902 made of an insulating member having the same diameter as that of a target substrate 903 and an RF electrode 901 directly onto a wall member (not illustrated) of the processing chamber. In addition, in this case, it is desirable to form an insulating protective layer 904 with a thickness of, e.g., about 1 μm by thermally spraying ceramic such as $Al_2O_3$, $Y_2O_3$ having excellent plasma resistance such that the RF electrode 901 is prevented from being exposed to a side surface of the holding table.

Figure 10:
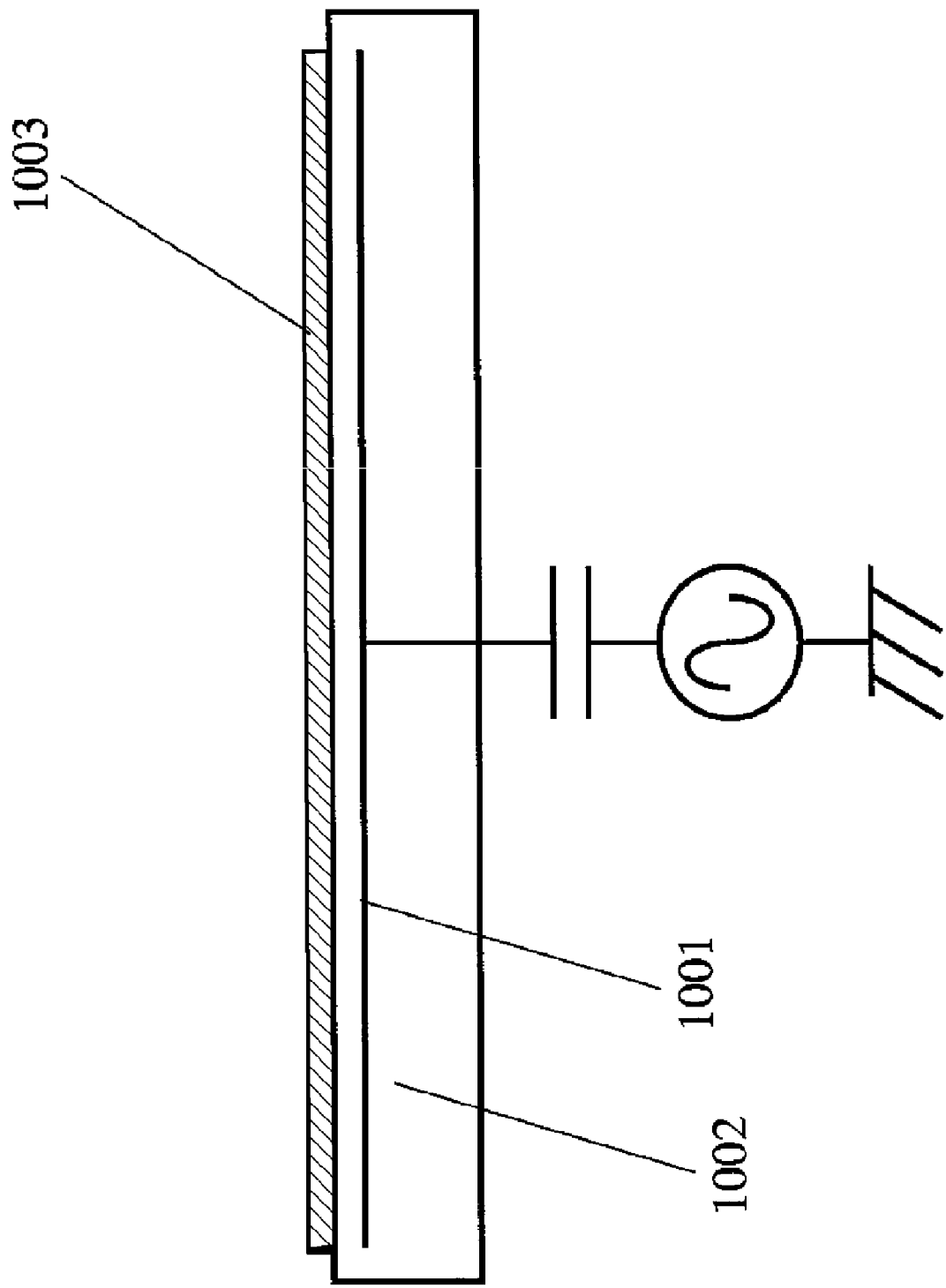
FIG. 10 is a schematic cross-sectional view to illustrate other major components of the ion implanting apparatus in accordance with the embodiment of the present invention.

Alternatively, as illustrated in FIG. 10, it is effective to limit a region on which high energy ions are irradiated substantially only to a target substrate 1003 by making a holding table 1002 by using ceramic such as $Al_2O_3$, $Y_2O_3$ having excellent plasma resistance and making a diameter of an RF electrode 1001 equal to or smaller than a diameter of the target substrate 1003.

Figure 11:
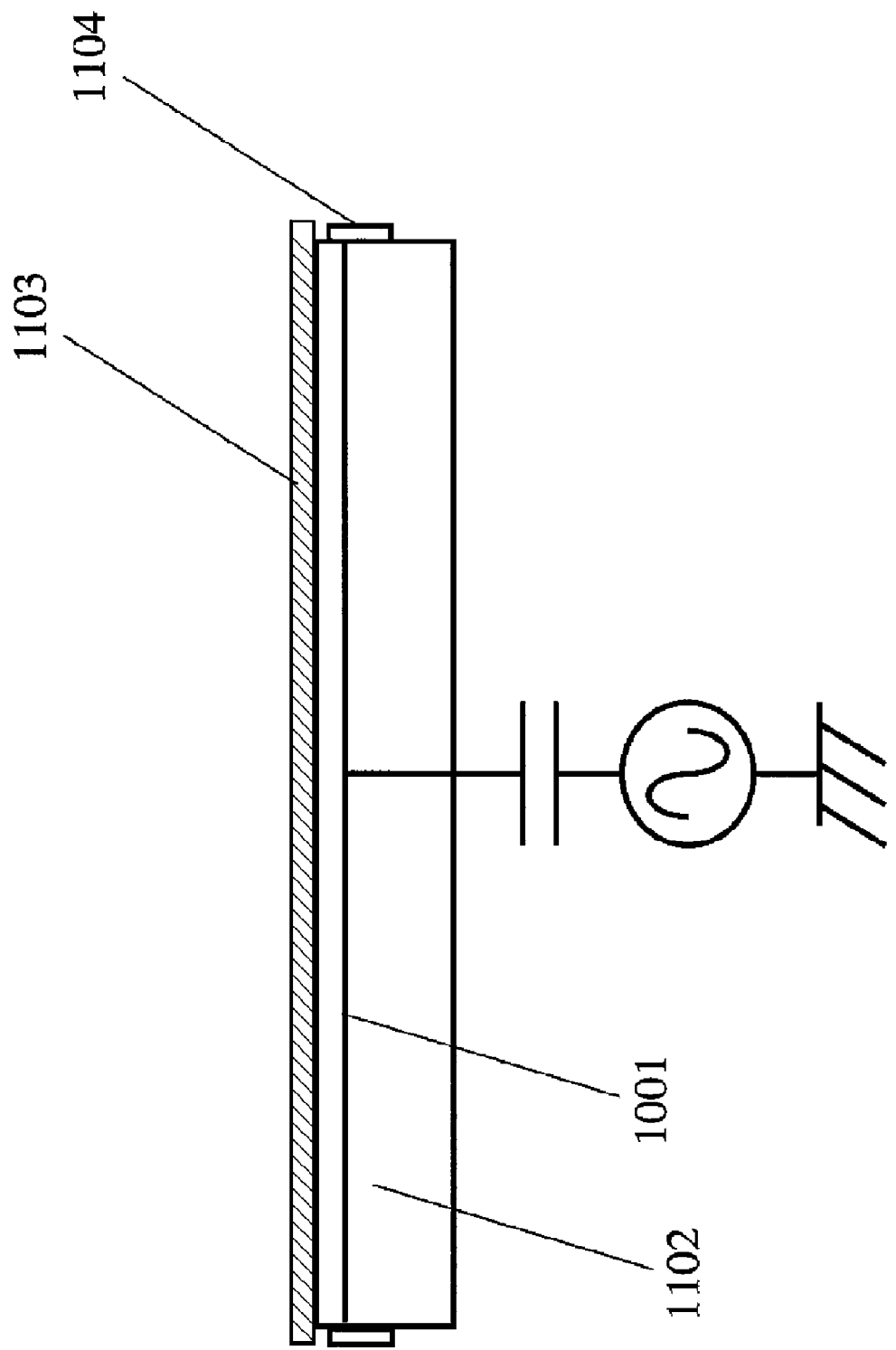
FIG. 11 is a schematic cross-sectional view to illustrate other major components of the ion implanting apparatus in accordance with the embodiment of the present invention.

Alternatively, as illustrated in FIG. 11, it may be also possible to make a holding table 1102 by using an insulating member whose diameter is smaller than that of a target substrate 1103 but equal to that of the RF electrode 1001. In this case, it is also desirable to form a protective layer 1104 with a thickness of, e.g., about 1 μm on a side surface of the holding table by thermally spraying ceramic such as $Al_2O_3$ or $Y_2O_3$ having excellent plasma resistance in order for the RF electrode 1101 not to be exposed to the side surface.

Further, the holding tables 1002 and 1102 illustrated in FIGS. 10 and 11 are installed by fastening them directly to a wall member (not illustrated) of the processing chamber.

Referring back to FIG. 1, it is desirable to make the ground plate 115 by using a material having high thermal conductivity and low resistivity in order to prevent the temperature from being excessively increased due to plasma heat. Used in the present embodiment is an Al alloy (Al containing Zr and Mg). It is desirable to form a strong protective film on a plasma-exposed surface of the ground plate 115 since a large quantity of ions are irradiated thereon from plasma. Formed in the present embodiment is an $Al_2O_3$ protective film with a thickness of about 0.5 μm by anodic oxidation using a non-aqueous solution. The protective film is not limited thereto, so it may be, e.g., a thermally sprayed film of $Y_2O_3$, a coating film formed by a sol-gel method, or an $Al_2O_3$ protective film on which the thermally sprayed film of $Y_2O_3$ or the sol-gel coating film is additionally formed thereon.

Further, it is desirable to make a temperature control medium flow through the inside of the ground plate 115 in order to quickly remove a heat flux generated by an ion-electron recombination on a surface of the ground plate 115 and perform an accurate temperature control (in particular, cooling) on the ground plate 115. In the present embodiment, the temperature is controlled to 150° C. by providing a medium flow path 120, through which a medium (in particular, a cooling medium such as a He gas, water, or other coolant having a high heat capacity) flows, within the ground plate 115. By controlling temperature of the ground plate 115 accurately, an increase in the temperature of the surrounding space or the target substrate 103 can be suppressed.

When a protective film is formed on the ground plate 115, an uppermost surface functions as an insulator. In case its thickness is thinner enough than a thickness of a sheath formed between the ground plate 115 and the plasma, sheath impedance generated between the plasma and the conductive portion of the ground plate 115 is not readily increased as compared to a case where there is no protective film, so that the ground plate 115 fully functions as a ground of the RF power. Detailed explanation will be provided below.

A thickness d of the sheath formed on a surface of an object in contact with the plasma is determined by the following formula 5.

$$d = 0.606 \lambda_D \left(\frac{2V_0}{T_e}\right)^{3/4} \quad \text{[Formula 5]}$$

Here, $V_0$ is a potential difference between the plasma and the object (unit: V), $T_e$ is an electron temperature (unit: eV), and $\lambda_D$ is a Debye length which is determined by the following formula 6.

$$\lambda_D = \sqrt{\frac{\varepsilon_0 k T_\varepsilon}{n_\varepsilon e^2}} = 7.43 \times 10^3 \sqrt{\frac{T_e \text{ [eV]}}{n_e \text{ [m}^{-3}\text{]}}} \text{ [m]} \quad \text{[Formula 6]}$$

Here, $n_e$ is an electron density of the plasma.

According to this formula, if the plasma having a density of about $10^{12}$ cm$^{-3}$ is excited, the thickness of the sheath is about 40 μm as shown in FIG. 3. In order to efficiently generate a self-bias on a wafer without increasing a plasma potential, it is necessary to lower the impedance between the ground plate 115 and the plasma at the RF power frequency. This impedance Z (an absolute value of impedance) can be determined by an equation $Z=1/(2\pi fC)$ (f is a frequency of power) where a capacity between the ground plate 115 and the plasma is expressed in terms of C. Accordingly, since Z is in inverse proportion to C, it is good to increase C as high as possible.

If the thickness of the sheath is expressed in terms of d; the thickness of the protective film is expressed in terms of t; and a dielectric constant of the protective film is expressed in terms of $\varepsilon_s$, the capacity C between the ground plate 115 and the plasma is determined by the following formula 7.

$$C = \left(\frac{d}{\varepsilon_0 S} + \frac{t}{\varepsilon_0 \varepsilon_s S}\right)^{-1} = \frac{\varepsilon_0 S}{\left(d + \frac{t}{\varepsilon_s}\right)} \quad \text{[Formula 7]}$$

In the present embodiment, d is 40 μm, t is 0.5 μm, and $\varepsilon_s$ is 9, so that a decrement of C is at most 1%. Therefore, the increase in the plasma potential caused by a formation of the protective film can be almost negligible. Further, it can be seen from the above formula that the increase in the plasma potential can be almost negligible even if the protective film with a thickness of several μm is formed.

Directly under the shower plate 106 as illustrated in FIG. 1, the high density plasma with a low electron temperature is generated by 2.45 GHz microwave supplied from the radial line slot antenna 111.

In order to prevent the microwave from penetrating into the plasma, it is desirable to set a microwave power such that a cut-off density $\omega^2 m \varepsilon_0/e^2$ corresponding to the 2.45 GHz frequency can be equal to or more than $7.5 \times 10^{10}$ cm$^{-3}$. Here, an angular frequency of the microwave is denoted by ω, permittivity in vacuum by $\varepsilon_0$, mass of an electron by m, and an elementary electric charge by e. Accordingly, the plasma in a surface wave mode is stably excited. Furthermore, in order to prevent the ground plate 115 from being heated by a microwave electric field and excite the plasma more stably, it is desirable to generate a microwave electric field in the plasma as weakly as possible.

A penetration depth of the microwave electric field into the plasma is characterized as a penetration length of the microwave into the plasma which is determined by the following formula 9 using an angular frequency $\omega_{pe}$ of the plasma which is determined by the following formula 8, when a speed of light in vacuum is denoted by c and electron density is denoted by n.

$$\sqrt{ne^2/(m\varepsilon_0)} \quad \text{[Formula 8]}$$

$$c/\sqrt{\omega_{pe}^2 - \omega^2} \quad \text{[Formula 9]}$$

Since the angular frequency of the plasma is increased in proportion to the root of the electron density, by increasing the electron density, the penetration length becomes short; the ground plate 115 can be prevented from being over-heated; and the plasma can be maintained more stably. That is, it would be better that a distance between the shower plate 106 and the ground plate 115 is longer than the penetration length. In particular, if the distance is about three times or more as long as the penetration length, the microwave power applied to the ground plate 115 is about 1% or less of input power, and thus the plasma can be maintained more stably.

In the present embodiment, the distance between the shower plate 106 and the ground plate 115 is set to be about 50 mm. Accordingly, it is good to excite plasma with an electron density of about $1.8 \times 10^{11}$ cm$^{-3}$ or more.

Hereinafter, an ion implanting method will be explained in sequence. For example, an ion implantation into a source/drain region of a MOS transistor is performed by generating ions such as $BF_2+$ for forming a p+ layer and $AsF_2+$ or $PF_2+$ for forming an n+ layer by plasma excitation and by accelerating the ions by a self-bias voltage generated on a surface of a wafer (target substrate 103) so as to implant them onto the wafer. For this reason, used as a plasma excitation gas supplied to the processing chamber 102 from the plasma excitation gas supply port 117 is a fluoride gas such as $BF_3$, $AsF_3$ or $PF_3$. It is not desirable to use, for example, a hydride gas such as diborane ($B_2H_6$) because when the plasma is excited, light ions such as H+ ions are formed and implanted into a deep region of the wafer, thereby generating a large quantity of defects.

Further, it is possible to perform plasma excitation with only the fluoride gas. However, if the plasma is excited with the fluoride gas, F— ions are generated, so that the plasma contains a small quantity of electrons therein. Therefore, it is efficient to dilute it with Ar ions in order to generate electrons. However, in this case, after Ar implantation, it is necessary to completely separate the implanted Ar ions by an annealing process.

When the fluoride gas is added, it can be seen that as explained above, the plasma electron density becomes low to be equal to or less than a cut-off density. For example, the plasma was excited with 1.6 $kW/cm^2$ power of 2.45 GHz microwave at a 200 sccm total flow rate of an $Ar/NF_3$ mixed gas and the plasma density was measured 75 mm below the shower plate. At this time, the electron density was maintained higher than about $7.5 \times 10^{10}$ $cm^{-3}$ when a ratio of the $NF_3$ in the mixed gas was in the range from about 0% to about 10%. However, when a pressure of the chamber was about 400 mTorr and the ratio was higher than 10% or when the pressure was about 300 mTorr and the ratio was higher than 20%, the electron density became equal to or lower than the cut-off density of about $7.5 \times 10^{10}$ $cm^{-3}$. Accordingly, the plasma was unstably excited in a chamber, so that the microwave was not reflected from the plasma but penetrated through the plasma to reach the target substrate, thereby damaging the substrate. However, it has been found that even in case that the pressure in the processing chamber was lowered to about 100 mTorr and the ratio of the fluoride gas was increased to about 80% or even in case that the pressure in the processing chamber was lowered to about 50 mTorr and the ratio of the fluoride gas was increased to about 100%, the electron density is not readily decreased and can be maintained equal to or higher than the cut-off density.

Further, in case that the plasma was excited with the microwave power of about 1.6 $kW/cm^2$ or more at a $NF_3$ ratio of about 100% and under the pressure of about 100 mTorr and the plasma density was measured 75 mm below the shower plate, it has been found that the electron density is surely higher than the cut-off density (about $1.4 \times 10^{11}$ $cm^{-3}$ at about 2.5 kW power) and the electron temperature is lowered (about 1.3 eV at about 2.5 kW power), so that the plasma is excited stably and the ion implantation can be performed without charge-up damage.

Furthermore, when the plasma is excited with a fluoride gas such as $BF_3$ or the like, generated is F radical which reacts with Si of the target substrate, and resultantly formed is $SiF_4$. Since $SiF_4$ is volatile at a normal temperature and thus, the silicon wafer serving as the target substrate is etched. A volatilization temperature of $SiF_4$ is about $-160°$ C. under a pressure of about 76 mTorr, so that in case that the pressure within the processing chamber is about 76 mTorr, it is possible to suppress such an etching by lowering the temperature of the target substrate to about $-160°$ C. or less. Even in case the pressure is about 76 mTorr or less, it is possible to suppress the radical etching by cooling the substrate with liquid nitrogen since the temperature ($-196°$ C.) of the liquid nitrogen is equal to or less than the volatilization temperature. Accordingly, it is desirable to make the liquid nitrogen flow through a temperature control medium path 116 in a holding table 104.

By the ion implantation, ions with positive charge are implanted into an ion implantation region of the target substrate and secondary electrons with negative charge are emitted, so that the ion implantation region is positively charged. In case the ions are implanted to form the source/drain region, it is needed to implant the ions with a dosage in a range from about $1 \times 10^{15}$ $cm^{-2}$ to about $5 \times 10^{15}$ $cm^{-2}$. About ten secondary electrons are emitted per an ion impact, so that positive charges in a range from about $1 \times 10^{16}$ $cm^{-2}$ to about $5 \times 10^{16}$ $cm^{-2}$ are accumulated.

In order to reduce an electric field intensity generated in a gate insulating film by the ion implantation, ion doses are divided and provided one thousand times. That is, while the microwave plasma is excited, the RF power is applied onto the target substrate in pulse mode. Only if the RF power is on, the self-bias voltage is generated and the ion implantation is performed. When the RF power is off, the charging of the target substrate is eliminated by the electrons in the plasma. Since the dosed ions are about $5 \times 10^{15}$ $cm^{-2}$ in total, a dosage is about $5 \times 10^{12}$ $cm^{-2}$ at one time. An implanted energy is set to be about 1.5 keV, i.e., the self-bias voltage generated by applying the RF power is set to be about 1.5 kV. In this case, a traveling distance of B within the Si is about several nm or less, so that a very thin p+/n junction can be formed. However, if ions having such an energy range are implanted into Si, about ten secondary electrons per ion are emitted, so that positive charges are accumulated about ten times as much as total amount of electric charges implanted by the implantation of the plasma ions. Meanwhile, when the plasma is excited with the Ar and the $BF_3$, a ratio of the electrons to F— ions is about 10%. Therefore, in order to neutralize the electric charges positively charged on the wafer by electrons at one-time pulse, a pulse interval needs to be about one hundred times longer than a pulse width. It is set that a sheet of wafer is processed per minute, a pulse width for applying a substrate bias is about 0.6 ms and a neutralization time by electrons is about 50.4 ms. That is, a 400 kHz RF power is applied at intervals of about 50.4 ms for a pulse width of about 0.6 ms. About one third of ions irradiated onto the wafer are $BF_2+$ (the rest is Ar+), so that a required ion current density J is determined by the following formula 10.

$$J = \frac{3 \times 5 \times 10^{12} \ (cm^{-2}) \times 1.6 \times 10^{-19} (Q)}{0.6 \times 10^{-3} \ (s)} \quad \text{[Formula 10]}$$
$$= 4 \times 10^{-3} \ A/cm^2$$

Since the current density is proportional to the plasma density, it is controlled by varying the plasma density with the microwave power for exciting the plasma. An RF non-application time is about one hundred times longer than an RF application time, so that the ion implantation can be performed without charging. In a more general way, the required ion current density J is determined as shown in the following formula 11.

$$J = \frac{De}{\alpha N \Delta t} \qquad \text{[Formula 11]}$$

Here, D is a dosage, e is an elementary electric charge, α is a ratio of implanted ions to plasma ions, N is the number of pulses, and Δt is a pulse width. Further, though the implanted ion is ionized to have a valence number 1 in this case, if there exist polyvalent ions, the elementary electric charge e is multiplied by a valence number and a current density for each ion having the valence number is calculated and then the sum of them is determined as a current density.

Second Embodiment

With reference to FIGS. 4 to 8, there will be explained an example of a device manufactured by using an ion implanting method of the present invention as a second embodiment of the present invention. Further, the same parts as described in the first embodiment are omitted.

Figure 4:
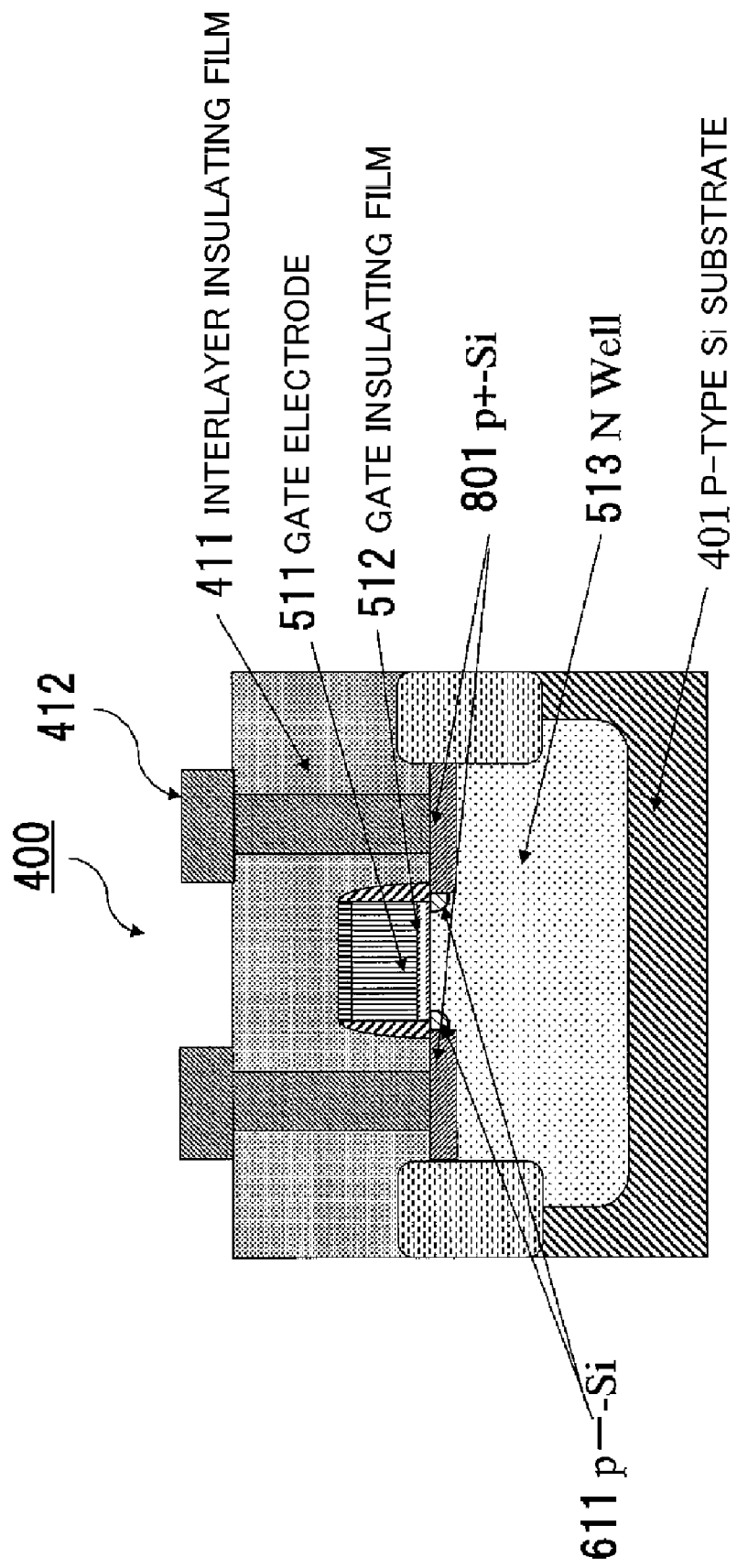
FIG. 4 is a schematic cross-sectional view illustrating a semiconductor device manufactured by using an ion implanting method in accordance with an embodiment of the present invention.
Figure 5:
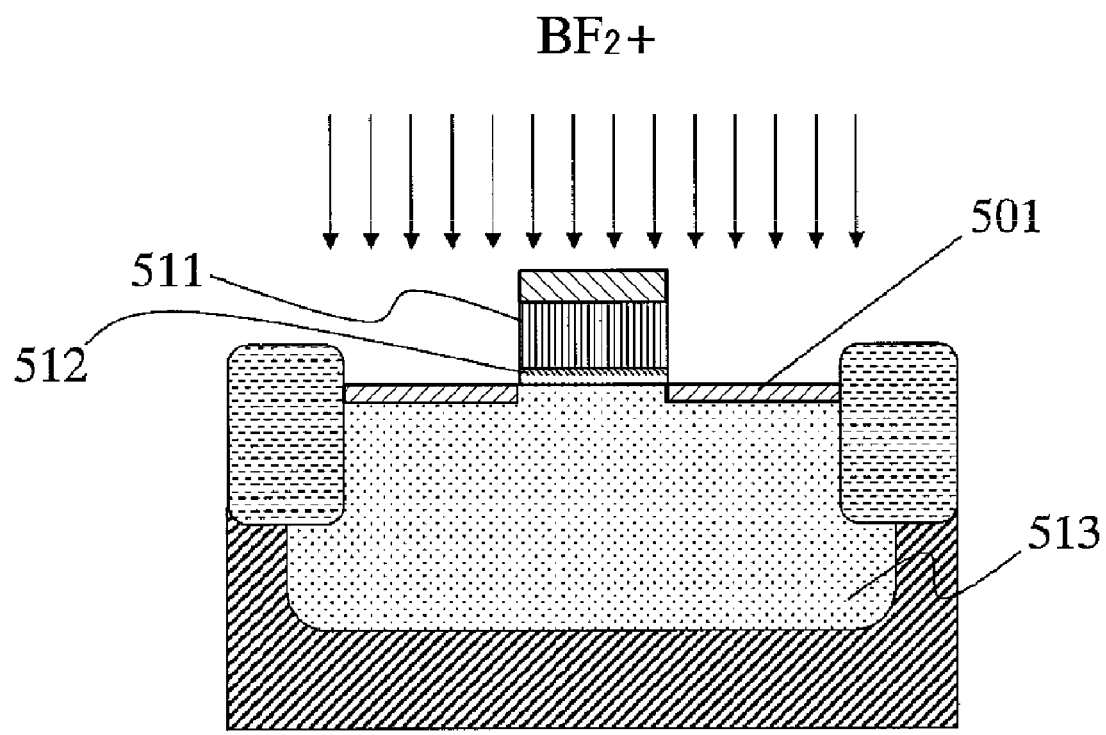
FIG. 5 is a schematic cross-sectional view to explain a manufacturing process of the semiconductor device of FIG. 4.
Figure 6:
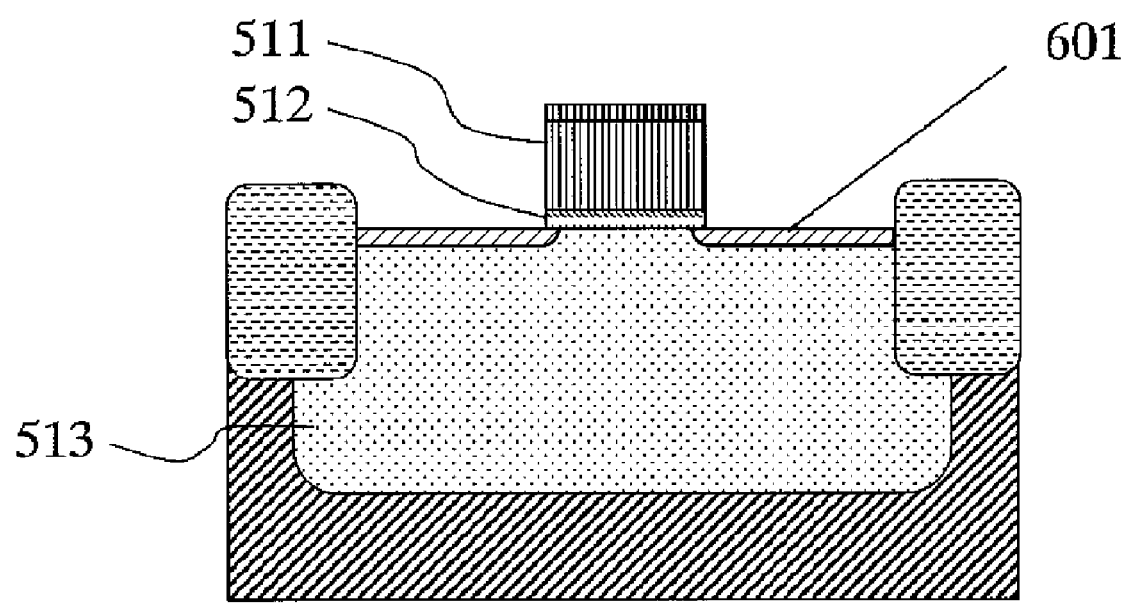
FIG. 6 is a schematic cross-sectional view to explain a manufacturing process of the semiconductor device of FIG. 4.

FIG. 4 illustrates a PMOS transistor 400 manufactured by using the ion implanting method of the present invention. FIGS. 5 to 8 illustrate a manufacturing process. FIG. 5 is a cross-sectional view when a gate electrode 511 is formed on a gate insulating film 512. The gate electrode 511 is made of polysilicon. Above all, in order to form a light doped drain region, $BF_2+$ is implanted into an n-well 513 in a p-type silicon substrate 401 by using the ion implanting method of the present invention. A $BF_3$ gas diluted with Ar is introduced into the processing chamber 102 illustrated in FIG. 1 so as to excite plasma. A pulse width for applying a substrate bias is set to be about 0.6 ms, a neutralization time by electrons to be about 50.4 ms and a dosage to be about $2 \times 10^{14}$ cm$^{-2}$. Therefore, an ion current is determined by the following formula 12.

$$J = \frac{3 \times 5 \times 10^{11} \text{ (cm}^{-2}) \times 1.6 \times 10^{-19}(Q)}{0.6 \times 10^{-3} \text{ (s)}} \qquad \text{[Formula 12]}$$

$$= 4 \times 10^{-4} \text{ A/cm}^2$$

Figure 7:
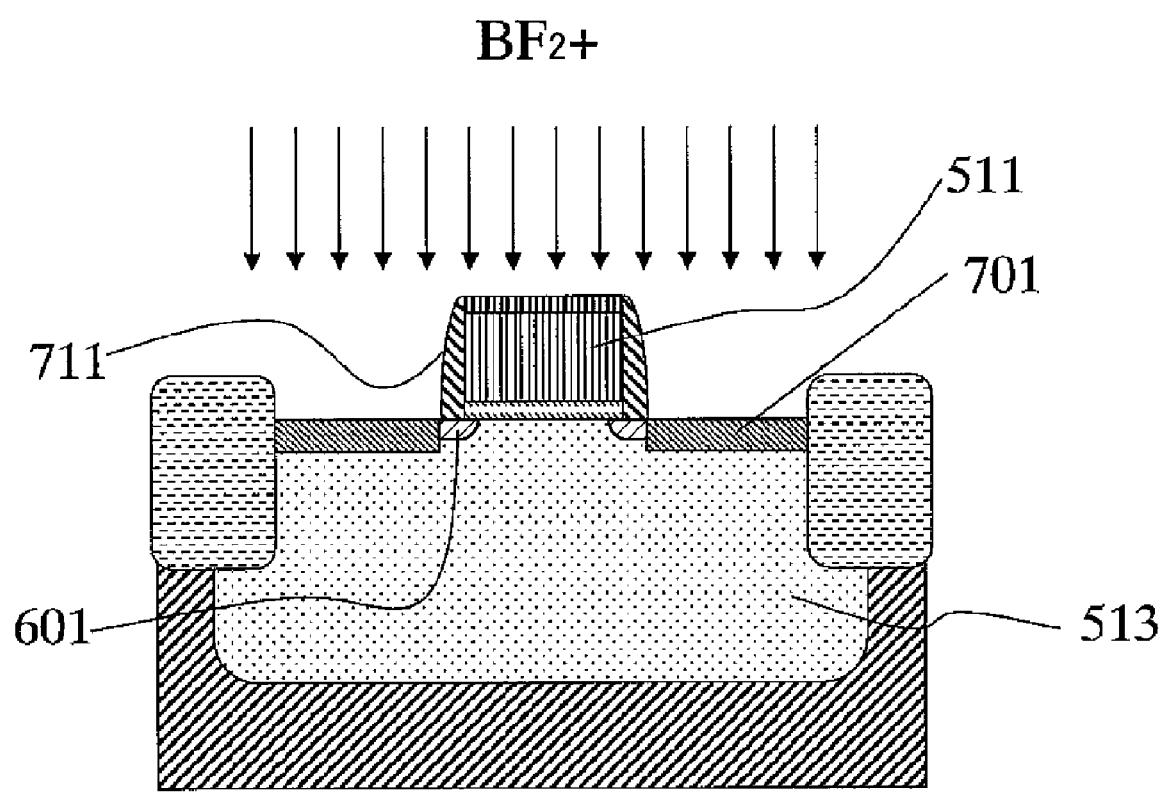
FIG. 7 is a schematic cross-sectional view to explain a manufacturing process of the semiconductor device of FIG. 4.
Figure 8:
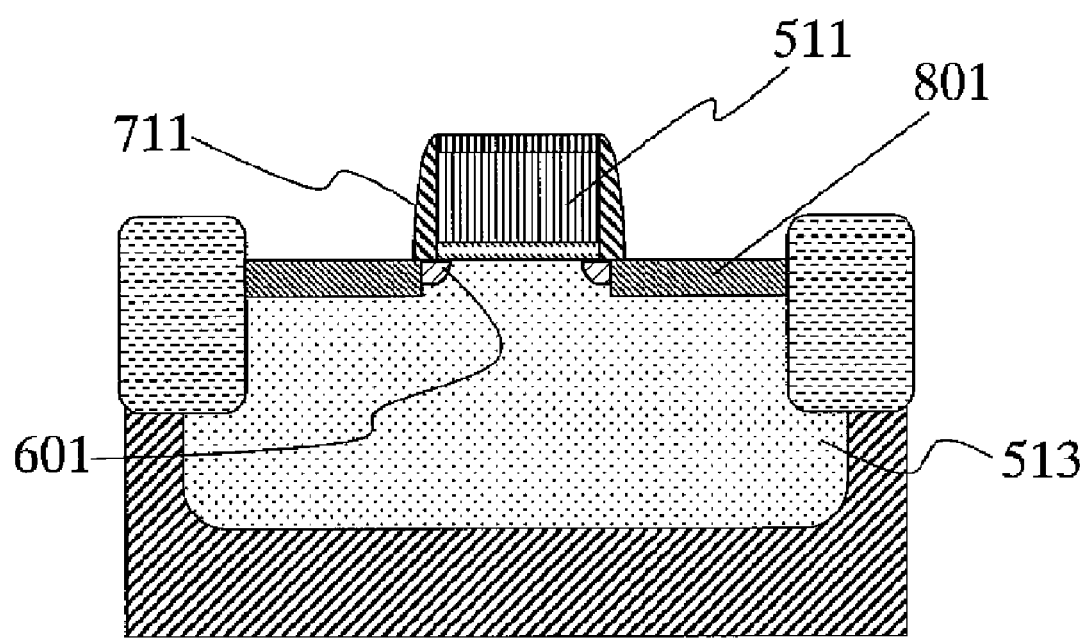
FIG. 8 is a schematic cross-sectional view to explain a manufacturing process of the semiconductor device of FIG. 4.

The substrate bias is set to be about 0.7 kV. Since an RF power frequency of the RF power supply 122 is set to be about 400 kHz, the period is longer than a sheath pass time of $BF_2+$. Therefore, since the $BF_2+$ completely follows the RF frequency, the maximum energy becomes about 1.4 kV which is twice the substrate bias, so that ion energy can be obtained efficiently. Further, liquid nitrogen is allowed to flow through the temperature control medium path 116 of the holding table 104. As a result, as indicated by a reference numeral 501 in FIG. 5, the $BF_2+$ is implanted up to a region with a thickness of about 5 nm in a depth direction. Thereafter, an activation annealing is performed at a temperature of about 600° C. for about 30 minutes, thereby forming a p-type high concentration layer having a carrier concentration of $10^{19}$ cm$^{-3}$ as indicated by a reference numeral 601 in FIG. 6. At the same time, implanted F and Ar are separated by such an annealing. Subsequently, as illustrated in FIG. 7, after a sidewall 711 made of $SiO_2$ is formed at a side wall of the gate electrode 511, ions with a dosage of $5 \times 10^{15}$ cm$^{-2}$ are implanted again in order to form a high concentration source/drain layer, in the same manner as in forming the light doped drain layer. At this time, ion current is determined by the following formula 13 and the substrate bias is set to be about 1.6 kV.

$$J = \frac{3 \times 5 \times 10^{12} \text{ (cm}^{-2}) \times 1.6 \times 10^{-19}(Q)}{0.6 \times 10^{-3} \text{ (s)}} \qquad \text{[Formula 13]}$$

$$= 4 \times 10^{-3} \text{ A/cm}^2$$

In this case too, since the $BF_2+$ completely follows the RF frequency, the maximum energy becomes about 3.2 kV which is twice the substrate bias, so that ion energy can be obtained efficiently. As a result, as indicated by a reference numeral 701 in FIG. 7, the $BF_2+$ is implanted into a region with a thickness of about 8 nm in a depth direction. Thereafter, an activation annealing is performed at a temperature of about 600° C. for about 30 minutes, thereby forming a p-type high concentration source/drain layer having a carrier concentration of $2 \times 10^{20}$ cm$^{-3}$ as indicated by a reference numeral 801 in FIG. 8. Subsequently, as illustrated in FIG. 4, by forming a contact silicide of the source/drain 801, an interlayer insulating film 411, a contact opening and a wiring 412, the PMOS transistor 400 is manufactured. Since the charge-up damage is completely removed when the ions are implanted, a transistor having a high mobility with a low leakage current can be implemented.

The present invention is not limited the above-described embodiments, so the target object may be other semiconductor substrates or made of other materials in need of ion implantation other than the silicon substrate, and the ion source gas may be other gases for generating ions required for implanting. The plasma excitation gas is not limited to Ar but may be other rare gases or other kinds of gases. Further, in the above-described example, the ion source gas has been used together with the plasma excitation gas as well or introduced into the processing chamber 102 through the shower plate 106 from the gas supply port 117 together with the plasma excitation gas, but ion source gas may be introduced into the processing chamber 102 through a different route from that of the plasma excitation gas.

As stated above, the present invention has been explained with reference to the embodiments, but the present invention is not limited to configurations or numbers described in the embodiments. For example, the frequency of the microwave is not limited to 2.45 GHz but may be, e.g., 915 MHz, and the plasma excitation gas is not limited to a mixed gas of Ar and fluoride ($BF_3$, $AsF_3$ or the like) but may be fluoride gas (one or more gases of $BF_3$ and $AsF_3$) only.

To be brief, the present invention is characterized by including a depressurizable processing chamber, a plasma excitation unit for exciting plasma within the processing chamber, a holding table installed in the processing chamber for holding a target substrate, a conductive member disposed so as to face the holding table in the processing chamber and having a portion through which the plasma is transmitted toward the holding table, and an application unit for applying a substrate bias RF power onto the target substrate held by the holding table, wherein the conductive member is electrically grounded with respect to a frequency of the RF power.

Furthermore, it is desirable that the plasma excitation unit includes an RLSA antenna for radiating microwave from a microwave source uniformly and a shower plate for discharging a plasma excitation gas into the processing chamber uniformly manner. Further, it is important to obtain an electron density in the plasma surely exceeding a cut-off density by setting a pressure in the processing chamber to be about 100 mTorr or less; to neutralize the substrate by electrons in the plasma during a non-application period by intermittently supplying the RF bias power with a frequency of about 400 kHz to the substrate; and to surely generate a self-bias with a voltage from about 1 kV to about 5 kV on the substrate without increasing a plasma potential by grounding a ground plate with respect to a RF power frequency of the substrate bias.

INDUSTRIAL APPLICABILITY

An application of the ion implanting apparatus and the ion implanting method in accordance with the present invention, in which charge-up damage is rarely occur, is not limited to the PMOS transistor of the embodiments but can be another semiconductor device, LSI, or other electronic devices in need of ion implantation.

What is claimed is:

1. An ion implanting apparatus comprising:
a depressurizable processing chamber;
a plasma excitation unit for exciting plasma within the processing chamber;
a holding table installed in the processing chamber, for holding a target substrate;
a ground plate disposed above the holding table so as to face the holding table in the processing chamber, having a portion through which the plasma is transmitted toward the holding table; and
an RF power application unit connected to the holding table and configured to apply RF power for substrate bias onto the target substrate held by the holding table,
wherein the ground plate is electrically grounded with respect to a frequency of the RF power.

2. The ion implanting apparatus of claim 1, wherein the plasma excitation unit includes:
a unit for supplying plasma excitation power to an inside of the processing chamber; and
a unit for supplying a plasma excitation gas to the inside of the processing chamber.

3. The ion implanting apparatus of claim 2, wherein the plasma excitation gas includes a source gas for ions to be implanted into the target substrate.

4. The ion implanting apparatus of claim 2, wherein a frequency of the plasma excitation power is in a range of a frequency of a microwave.

5. The ion implanting apparatus of claim 4, wherein the plasma excitation gas includes a fluoride gas, and a pressure within the processing chamber is set such that an electron density of the plasma in a space opposite to the holding table with respect to the ground plate is maintained higher than a cut-off density determined by $\omega^2 m \in_0 /e^2$ where an angular frequency of the microwave is $\omega$, a permittivity in vacuum is $\in_0$, mass of an electron is m, and an elementary electric charge is e.

6. The ion implanting apparatus of claim 2, wherein the unit for supplying the plasma excitation power to the inside of the processing chamber includes:
a microwave source;
a flat plate antenna; and
a unit for transmitting a microwave from the microwave source to the antenna,
wherein the antenna is disposed to face the holding table with a dielectric plate therebetween, and
the microwave radiated from the antenna propagates through the dielectric plate and irradiates the plasma excitation gas in the processing chamber so as to generate plasma.

7. The ion implanting apparatus of claim 6, wherein the unit for supplying the plasma excitation gas includes a plurality of gas paths for discharging the plasma excitation gas into the processing chamber via a gas supply port and an inside of the dielectric plate, and
wherein the plasma is generated in a space where the plasma excitation gas is discharged into the processing chamber from the dielectric plate or in its vicinity.

8. The ion implanting apparatus of claim 7, wherein within the processing chamber, an electron density of the plasma in a space opposite to the holding table with respect to the ground plate and at a position where the plasma is in contact with the dielectric plate at a side of the ground plate with a plasma sheath therebetween is higher than a cut-off density determined by $\omega^2 m \in_0 /e^2$ where an angular frequency of the microwave supplied to the antenna is $\omega$, a permittivity in vacuum is $\in_0$, mass of an electron is m, and an elementary electric charge is e.

9. The ion implanting apparatus of claim 7, wherein when a plasma angular frequency determined by the following formula 1 (where, n is an electron density of plasma at a position where the plasma is in contact with the dielectric plate at a side of the ground plate with a plasma sheath therebetween, $\in_0$ is a permittivity in vacuum, m is mass of an electron, and e is an elementary electric charge) is $\omega_{pe}$ and an angular frequency of the microwave supplied to the antenna is $\omega$, a distance between the dielectric plate and the ground plate is longer than a microwave penetration depth determined by the following formula 2 (here, c is speed of light in vacuum).

$$\sqrt{ne^2/(m\in_0)} \qquad \text{[Formula 1]}$$

$$c/\sqrt{\omega_{pe}^2 - \omega^2} \qquad \text{[Formula 2]}$$

10. The ion implanting apparatus of claim 7, wherein when a plasma angular frequency determined by the following formula 3 (where n is an electron density of plasma at a position where the plasma is in contact with the dielectric plate at a side of the ground plate with a plasma sheath therebetween, $\in_0$ is a permittivity in vacuum, m is mass of an electron, and e is an elementary electric charge) is $\omega_{pe}$ and an angular frequency of the microwave supplied to the antenna is $\omega$, a distance between the dielectric plate and the ground plate is three or more times longer than a microwave penetration depth determined by the following formula 4 (here, c is speed of light in vacuum).

$$\sqrt{ne^2/(m\in_0)} \qquad \text{[Formula 3]}$$

$$c/\sqrt{\omega_{pe}^2 - \omega^2} \qquad \text{[Formula 4]}$$

11. The ion implanting apparatus of claim 7, wherein a porous ceramic member is installed at each gas discharge position of the plurality of gas paths, and the plasma excitation gas is introduced into the processing chamber from the porous ceramic member.

12. The ion implanting apparatus of claim 7, wherein each gas discharge hole of the plurality of gas paths has a diameter two or less times larger than a thickness of a sheath formed between the dielectric plate and the plasma, and the plasma excitation gas is introduced into the processing chamber from the gas discharge hole.

13. The ion implanting apparatus of claim 6, wherein the antenna is a radial line slot antenna.

14. The ion implanting apparatus of claim 2, wherein in the processing chamber, an electron density of the plasma in a space opposite to the holding table with respect to the ground plate is higher than a cut-off density determined by $\omega^2 m \in_0 /e^2$ where an angular frequency of the plasma excitation power is ω, a permittivity in vacuum is $\epsilon_0$, mass of an electron is m, and an elementary electric charge is e.

15. The ion implanting apparatus of claim 1, wherein the ground plate is electrically grounded with respect to a direct current.

16. The ion implanting apparatus of claim 1, wherein at least a portion of inner walls of the processing chamber in contact with the plasma and a surface of the ground plate are coated with at least one of metal oxide and metal nitride.

17. The ion implanting apparatus of claim 1, wherein the ground plate includes therein a unit through which a temperature control medium flows.

18. The ion implanting apparatus of claim 1, wherein a period of the frequency of the RF power is longer than a time during which implantation atom ions or implantation molecule ions released from the plasma toward a plasma sheath formed on a surface of the target substrate reaches the target substrate.

19. The ion implanting apparatus of claim 1, further comprising:
a unit for cooling the holding table.

* * * * *